(12) United States Patent  
Schatz et al.

(10) Patent No.: US 9,030,198 B2
(45) Date of Patent: May 12, 2015

(54) MAGNETIC FIELD SENSOR AND METHOD FOR PRODUCING A MAGNETIC FIELD SENSOR

(75) Inventors: Frank Schatz, Kornwestheim (DE); Tino Fuchs, Tuebingen (DE); Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 411 days.

(21) Appl. No.: 13/321,759

(22) PCT Filed: Jul. 26, 2010

(86) PCT No.: PCT/EP2010/060780
§ 371 (c)(1),
(2), (4) Date: Feb. 6, 2012

(87) PCT Pub. No.: WO2011/020678
PCT Pub. Date: Feb. 24, 2011

(65) Prior Publication Data
US 2012/0126799 A1 May 24, 2012

(30) Foreign Application Priority Data
Aug. 21, 2009 (DE) .......................... 10 2009 028 815

(51) Int. Cl.
*G01N 27/72* (2006.01)
*G01R 33/04* (2006.01)
*H01F 27/28* (2006.01)

(52) U.S. Cl.
CPC ............ *G01R 33/04* (2013.01); *H01F 27/2804* (2013.01)

(58) Field of Classification Search
None
See application file for complete search history.

(56) References Cited

U.S. PATENT DOCUMENTS

| 5,831,431 | A | 11/1998 | Gottfried-Gottfried et al. |
| 6,404,192 | B1 * | 6/2002 | Chiesi et al. ................... 324/253 |
| 6,803,848 | B2 * | 10/2004 | Yeo et al. ........................ 336/200 |
| 2003/0004301 | A1 | 1/2003 | Wandel et al. |
| 2010/0259349 | A1 * | 10/2010 | Li ................................. 336/200 |

FOREIGN PATENT DOCUMENTS

| CN | 1274853 | 11/2000 |
| CN | 1675561 | 9/2005 |
| CN | 1755327 | 4/2006 |
| CN | 101305291 | 11/2008 |
| CN | 202929182 | 5/2013 |
| DE | 4442441 | 8/1995 |
| EP | 1052519 | 11/2000 |
| JP | 9-508466 | 8/1997 |
| JP | 2004-166401 | 6/2004 |

(Continued)

OTHER PUBLICATIONS

International Search Report, PCT International Application No. PCT/EP2010/060780, dated Oct. 4, 2010.

(Continued)

*Primary Examiner* — Patrick Assouad
*Assistant Examiner* — Stephen G Armstrong
(74) *Attorney, Agent, or Firm* — Kenyon & Kenyon LLP

(57) ABSTRACT

A magnetometer is described, having a substrate and a magnetic core, the substrate having an excitation coil for generating a magnetic flux in the magnetic core; and the excitation coil having a coil cross section, which is aligned generally perpendicular to a main plane of extension of the substrate. The magnetic core is situated outside the coil cross section.

9 Claims, 1 Drawing Sheet

(56) References Cited

FOREIGN PATENT DOCUMENTS

| | | |
|---|---|---|
| JP | 2008-288071 | 11/2008 |
| TW | 2003-00496 | 6/2003 |

OTHER PUBLICATIONS

Chiesi, L. et al., "CMOS Planar 2D Micro-fluxgate Sensor," *Sensors and Actuators A*, vol. 82, No. 1-3, May 1, 2000, pp. 174-180.

Choi, S.O. et al., "An Integrated Micro Fluxgate Magnetic Sensor," *Sensors and Actuators A*; vol. 55, No. 2, Jul. 31, 1996, pp. 121-126.

Choi, W.Y. et al., "Two-axis Micro Fluxgate Sensor on Single Chip," *Microsystems Technologies*, vol. 12, No. 4, Mar. 1, 2006, pp. 352-356.

Drljaca, P.M. et al., "Low-power 2-D Fully Integrated CMOS Fluxgate Magnetometer," *IEEE Sensors Journal*, vol. 5, No. 5, Oct. 2005, pp. 909-915.

Gottfried-Gottfried, R, "A Miniaturized Magnetic-field Sensor System Consisting of a Planar Fluxgate Sensor and a CMOS Readout Circuitry," Fraunhofer Institute for Microelectronic Circuits and Systems IM52, Dresden, Germany, Jun. 1995.

* cited by examiner

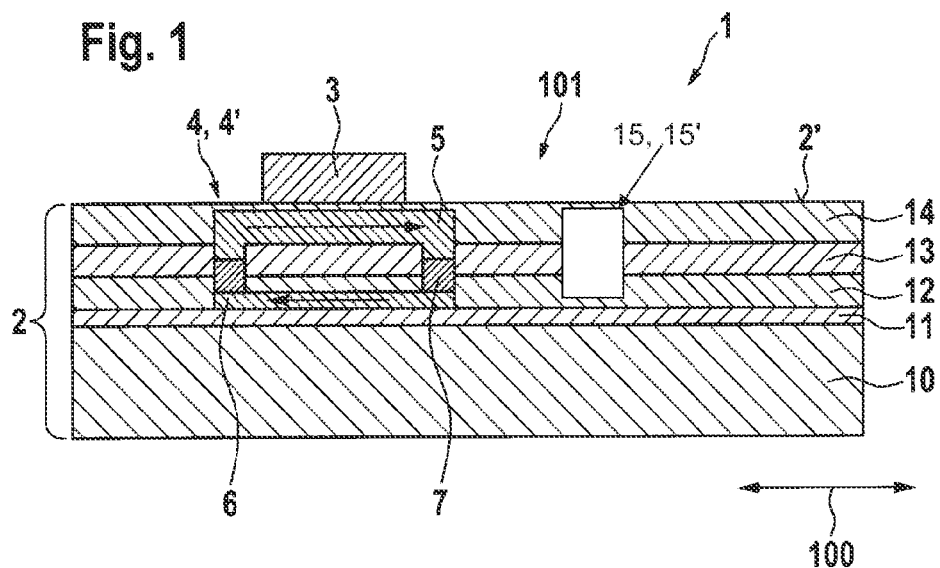
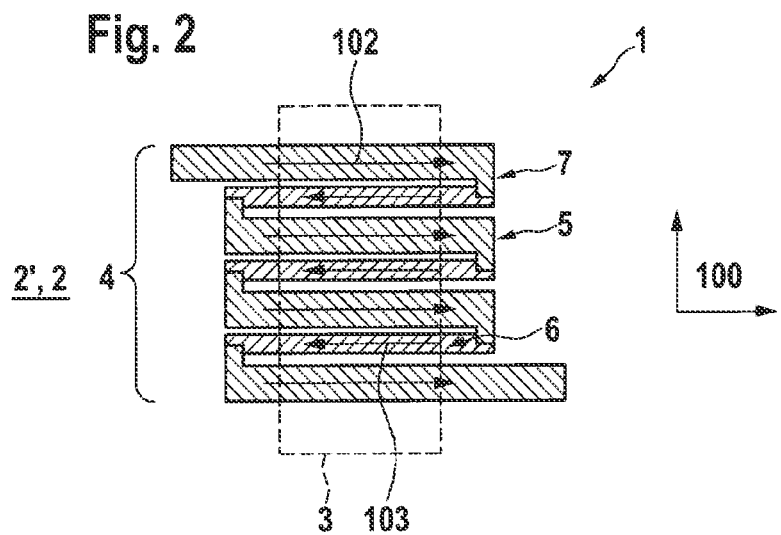
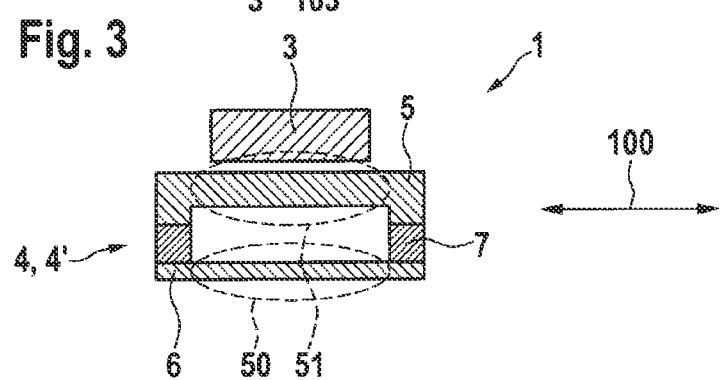

MAGNETIC FIELD SENSOR AND METHOD FOR PRODUCING A MAGNETIC FIELD SENSOR

FIELD OF THE INVENTION

The present invention is directed to a magnetic field sensor.

BACKGROUND INFORMATION

Micromechanical magnetic field sensors are generally available. German. Patent No. DE 44 42 441 A1 and European Patent No. EP 1 052 519 B1, for example, describe magnetic field sensors of the so-called "fluxgate" type, which include a semiconductor substrate, an excitation element, two detection coils, and a magnetic core. The excitation element, in this context, includes in each case an excitation coil, which is operated using an alternating current having an excitation frequency, whereby in the magnetic core a magnetic flux according to the magnetic hysteresis (B-H curve) of the same frequency is generated. The magnetic core includes a ferromagnetic material, which is brought periodically to magnetic saturation by the excitation element. In this instance, magnetic saturation means that an additional external field does not generate any substantial increase in the magnetic flux in the magnetic core. The magnetic flux in the magnetic core is proportional to the product of magnetic permeability and magnetic field. The permeability is accordingly comparatively low in the saturation range, whereas it is comparatively high in the zero crossing of the magnetic hysteresis. Due to the non-linearity of the permeability, a present external magnetic field, that is to be measured, causes a distortion of the magnetic flux, which is detectable with the aid of the detection coils. For this purpose, the detection coils are positioned in a contrary sense about the magnetic core, so that the sum of the induction currents induced in the detection coils by the magnetic flux in the magnetic core is equal to zero in the absence of an external magnetic field that is to be measured. In the presence of an external magnetic field that is to be measured, because of the nonlinear permeability of the ferromagnetic magnetic core, each of the induction currents includes different harmonics of the excitation frequency, which are a function of the external magnetic field. The sum of the induction currents is therefore not equal to zero and is a measure for the strength of the external magnetic field that is to be measured.

Conventionally, the excitation coil includes a coil cross section which is aligned perpendicular to a main plane of extension of a substrate of the system, the coil cross section being penetrated centrically by the magnetic field. It is disadvantageous in this system that the flux-conducting structure is not able to be implemented in the system in a standard CMOS process. Based on the materials nickel and iron that are unusual in the CMOS process, there is increased danger of contamination, so that this step is not applicable in many CMOS lines. In addition, conventionally, an excitation coil is provided that has a coil cross section that is parallel to the main plane of extension. Because of the planar design of this excitation coil, the implementation of such a magnetic field sensor takes up comparatively much space and is thus costly.

SUMMARY

An example magnetic field sensor, according to the present invention, and example method according to the present invention, for producing a magnetic field sensor, may have the advantage that a comparatively compact installation space is made possible, and consequently a cost-effective implementation of a magnetic field sensor, at the same time, contamination in the production of the magnetic field sensor by foreign materials being excluded, especially during the insertion of the magnetic core. The example magnetic field sensor according to the present invention is thereby advantageously producible in a standard semiconductor production process, especially in a CMOS process. This is achieved in that the excitation coil has a coil cross section which is aligned essentially perpendicular to the main plane of extension of the substrate, the magnetic core being preferably situated on the substrate in the radial direction of the coil cross section outside the coil cross section. This has the advantage that the production of electrical and electronic structures in the substrate, and particularly the production of excitation coils and/or detection coils in the substrate take place independently of the situation of the magnetic core on the substrate, and consequently, is able to be implemented in standard semiconductor production methods, particularly in a CMOS process. The introduction of foreign particles in the substrate is excluded, in this context. The magnetic core, in particular, is situated on a surface of the substrate only after the sealing of the substrate. The concept "coil cross section", within the meaning of the present invention, includes especially that surface of the excitation coil which is aligned perpendicular to the magnetic field induced by the excitation coil and is bordered on the outside by the windings of the excitation coil. In an advantageous manner, in spite of the situation of the magnetic core outside the excitation coil, a magnetic flux is induced in the magnetic core by the excitation coil, which is available for sensor situation according to the "fluxgate" sensor principle. In any desired specific embodiment, the substrate preferably includes a semiconductor substrate and, especially preferred, a silicon substrate.

According to one preferred specific embodiment, it is provided that the magnetic core is situated perpendicular to the main plane of extension, outside the coil cross section and preferably on an, in particular, outer surface of the substrate. Consequently, in an advantageous manner, a comparatively simple and cost-saving production of the magnetic field sensor is made possible by situating the magnetic core simply on or perpendicular to the main plane of extension above the excitation coil, after the production of the electrical and electronic structures in the substrate, particularly in a standard CMOS process. This is preferably carried out in a self-contained production process. A surface, within the meaning of the present invention, includes particularly a planar surface of the substrate and/or an indentation on a surface of the substrate, into which the magnetic core is inserted.

According to one preferred specific embodiment it is provided that the substrate includes a layer construction, the excitation coil including a plurality of supply conductors and a plurality of return conductors; the plurality of supply conductors and the plurality of return conductors being preferably situated in different layers of the layer construction, perpendicular to the main plane of extension and/or on different sides of the substrate. Consequently, it is particularly advantageous that the excitation coil is producible in standard semiconductor production methods, the supply conductors and the return conductors being implemented in different metallization planes, which are preferably connected to one another using electrical contact elements, so-called "vias". This makes possible a comparatively cost-effective production of a magnetic field sensor. The return conductors are used particularly to connect the individual supply conductors of the plurality of supply conductors to one another in an electrically conductive manner. The plurality of supply conductors are situated particularly preferably on the back side of the substrate. Consequently, in an advantageous manner, the distance between supply conductors and return conductors is comparatively large, so that a greater electrical field is achieved.

According to one preferred specific embodiment, it is provided that, perpendicular to the main plane of extension, an at least partial overlapping of the plurality of supply conductors by the magnetic core is provided. Consequently, a magnetic flux is advantageously induced in the magnetic core by the excitation coil and particularly by a current flow through the supply conductors. The magnetic core is preferably alternately driven into magnetic saturation, in this context, and is consequently available for the detection of an external magnetic field according to the "fluxgate" principle.

According to one preferred specific embodiment, it is provided that, perpendicular to the main plane of extension, the plurality of supply conductors is situated generally between the magnetic core and the plurality of return conductors. Consequently, in an advantageous manner, the distance between the magnetic core and the supply conductors is clearly less than the distance between the magnetic core and the return conductors, so that the magnetic flux, which is generated by the supply conductors at the location of the magnetic core, is clearly greater than the magnetic flux that is generated by the return conductors in the area of the magnetic core. The resulting total magnetic flux is thus determined by the magnetic flux generated by the supply conductors, and is not equal to zero, so that the magnetic core is brought to magnetic saturation by a current flow in the excitation coil. The magnetic core preferably includes a soft magnetic material and particularly an iron-nickel alloy. Thus, the magnetic core is comparatively easy to magnetize.

According to one preferred specific embodiment, it is provided that the magnetic field sensor has detection coils for reading out a magnetic flux in the magnetic core, the detection coils preferably including coil cross sections which are aligned parallel and/or perpendicular to the main plane of extension. The detection coils are preferably situated in the opposite direction to one another, so that the magnetic flux induced by the excitation coil in the magnetic core leads to electrical detection currents in the detection coils which, in the absence of an external field that is to be measured, mutually cancel each other out. In the presence of an external magnetic field that is to be measured, the additional vector component of this external magnetic field will induce a resultant signal in the detection coils, which is proportional to the external magnetic field that is to be measured. The coil cross sections of the detection coils are aligned either parallel or perpendicular to the main plane of extension. Consequently, in an advantageous manner, either a comparatively compact installation space arrangement of the detection coils having a coil cross section perpendicular to the main plane of extension is implemented, just as in the case of the excitation coils, the magnetic core being situated particularly outside the coil cross section, or a comparatively simple coil positioning is implemented on the surface of the substrate, in this case, the coil cross section being aligned generally parallel to the main plane of extension. The detection coils are usually developed to be clearly smaller than the excitation coils, so that the additional installation space required is comparatively small in the case of a coil cross section that is parallel to the main plane of extension.

According to another preferred specific embodiment, it is provided that contact elements and/or dielectric layers are situated perpendicular to the main plane of extension, between the supply conductors and the return conductors. The supply conductors and the return conductors are advantageously contacted electrically to one another, the contact elements particularly including so-called "vias", which connect different metallization planes to one another, in the semiconductor production process. The dielectric layers are preferably provided to insulate electrically from one another the supply conductors from the respective return conductors, in the coil cross section. The dielectric layers especially include oxide layers, which are positioned, according to standards, between different metallization planes, in the semiconductor production process. Thus, a comparatively cost-effective production of the excitation coil is advantageously made possible in the standard semiconductor production process.

The present invention further provides an example method for producing a magnetic field sensor, the substrate being provided in a first production step; the excitation coil being produced in the substrate in a second production step; and in a third production step, the magnetic core being positioned in the radial direction of the coil cross section, outside the coil cross section. Thus, a clearly more cost-effective production of a comparatively compact installation space magnetic field sensor is made possible. This is achieved in that the first and the second production step in standard semiconductor production processes, especially in a standard CMOS process, are able to be implemented, so that only in the third production step an additional method is required, in which only the magnetic core has to be positioned on the substrate in the area of the excitation coil. In particular, positioning the magnetic core during the production of the excitation coil is not necessary, so that contamination of the semiconductor material, by magnetic core materials, is prevented. In an advantageous manner, in spite of the situation of the magnetic core outside the excitation coil, a magnetic flux is induced in the magnetic core by the excitation coil, which is available for sensor situation according to the "fluxgate" sensor principle.

According to one preferred specific embodiment, it is provided that, in the third production step, the magnetic core is positioned perpendicular to the main plane of extension, outside the coil cross section, and preferably on a, particularly, outer surface of the substrate, so that the third production step is able to be carried out comparatively simply and cost-effectively.

According to yet another specific embodiment, it is provided that, in a first partial step of the second production step, the plurality of return conductors is generated, that in a second partial step of the second production step, the plurality of supply conductors is generated and/or that in a third partial step of the second production step, a plurality of contact elements and/or a plurality of dielectric layers are generated in the substrate. The third partial step, in this context, is preferably carried out during and/or after the first or second partial step. It is particularly preferred if the first, second and/or third partial step is carried out repeatedly. The excitation coil is thus advantageously producible in a standard semiconductor production process, various metallization layers being deposited on the substrate one after the other. In a lower metallization plane, the plurality of return conductors is produced within the scope of the first partial step, which are each electrically insulated from one another, in this context. In a later second partial step, an additional metallization plane is then deposited on the substrate, in which the plurality of supply conductors is produced. The supply conductors are electrically insulated from one another, in this instance. In an advantageous manner, the return conductors and the supply conductors, which are situated in different metallization planes, are connected to one another by the contact elements, so-called vias. On the inside of the excitation coil, the return conductors and the corresponding supply conductors are electrically insulated from one another by the dielectric layers. In one alternative specific embodiment it is provided that, during the second production step, the detection coils of the magnetic field sensor are also produced.

Exemplary embodiments of the present invention are illustrated in the drawings and explained in greater detail below.

BRIEF DESCRIPTION OF THE DRAWINGS

FIG. 1 shows a schematic sectional view of a magnetic field sensor according to an exemplary specific embodiment of the present invention.

FIG. 2 shows a schematic top view of a magnetic field sensor according to an exemplary specific embodiment of the present invention.

FIG. 3 shows a schematic side view of an excitation coil and a magnetic core of a magnetic field sensor according to the exemplary specific embodiment of the present invention.

DETAILED DESCRIPTION OF EXAMPLE EMBODIMENTS

In the various figures, identical parts are denoted by the same reference symbols and are therefore usually labeled or mentioned only once.

FIG. 1 shows a schematic sectional view of a magnetic field sensor 1 according to an exemplary specific embodiment of the present invention. Magnetic field sensor 1 includes a substrate 2, in which an excitation coil 4 is situated, preferably a semiconductor substrate and especially preferably a silicon substrate. Excitation coil 4 has a coil cross section 4', which is aligned perpendicular to a main plane of extension 100 of substrate 2, and is bordered by the windings of excitation coil 4. In the area of excitation coil 4, on a surface 2' of substrate 2, a magnetic core 3 is arranged so that magnetic core 3 is located in the radial direction of coil cross section 4' outside coil cross section 4'. Excitation coil 4 includes supply conductors 5 and return conductors 6, which are connected to one another with the aid of contact elements 7, in an electrically conductive manner.

The distance between supply conductors 5 and magnetic core 3 perpendicularly to main plane of extension 100 is clearly less than the distance between return conductors 6 and magnetic core 3 perpendicularly to main plane of extension 100, since supply conductors 5 are situated essentially between magnetic core 3 and return conductors 6 perpendicularly to main plane of extension 100. When there is a current flow through excitation coil 4, a magnetic flux is generated in magnetic core 3, once by supply conductors 5 and once by return conductors 6. Since the distance between supply conductors 5 and magnetic core 3 is clearly less, at the same current flow through return and supply conductors 5, 6, the magnetic flux induced by supply conductors 5 in magnetic 3 will be clearly greater than the magnetic flux produced in magnetic core 3 by return conductors 6. Thus, a current flow through excitation coil 4 produces a resultant magnetic flow in magnetic core 3, whereby magnetic core 3 is particularly driven into magnetic saturation, and is available for sensor devices according to the "fluxgate" sensor principle (also called Foerster probe). Excitation coil 4 is constructed in a multi-layer construction in substrate 2. For this purpose, substrate 2 includes a wafer 10, on which a first oxide layer 11 is deposited. On first oxide layer 11, in a first partial step of a second production step, a first metallization plane is deposited, in which a plurality of return conductors 6 is produced, the plurality of return conductors 6 being electrically insulated from one another. On this first metallization plane dielectric layers 12, 13 and contact elements 7 are deposited within dielectric layers 12, 13. In a second partial layer of the second production step, a second metallization plane is deposited, in which the plurality of supply conductors 5 is produced. Supply conductors 5 of the plurality of supply conductors 5, in turn, are electrically insulated from one another. On the second metallization plane, an additional dielectric layer 14 is deposited. Dielectric layers 12, 13 and additional dielectric layer 14 preferably include an oxide, and especially preferred, silicon dioxide. The plurality of return conductors 6 and the plurality of supply conductors 5 preferably include metal. Return conductors 6 and supply conductors 5 are connected to one another in an electrically conductive manner using contact elements 7, so-called "vias", so that in substrate 2 an excitation coil 4 is implemented, which extends parallel to main plane of extension 100 in substrate 2. It is preferably provided that magnetic field sensor 1 includes detection coils which are not shown in FIG. 1, and are provided for the detection of an external magnetic field that is to be measured in magnetic core 3, for example, an Earth magnetic field or a magnetic field starting from a test sample. These detection coils preferably include coil cross sections which are aligned either parallel or perpendicular to main plane of extension 100. The example magnetic field sensor 1 is producible particularly in a standard semiconductor production method and especially in a CMOS process.

FIG. 2 shows a schematic top view of a magnetic field sensor 1 according to the first specific embodiment of the present invention, in FIG. 2 a top view of magnetic field sensor 1 shown in FIG. 1 being shown along arrow 101. For reasons of clarity, FIG. 2 shows only the plurality of supply conductors 5, the plurality of return conductors 6, contact elements 7 and magnetic core 3. Supply conductors 5 are aligned generally parallel to one another and are at a distance from one another. In the plane of supply conductors 5, the various supply conductors 5 are in each case electrically insulated from one another, while in the plane of return conductors 6, the individual return conductors 6 are electrically insulated from one another. Supply conductors 5 are connected electrically to corresponding return conductors 6 respectively via contact elements 7. In each case one end of a supply conductor 5 is connected to a return conductor 6, while another end of supply conductor 5 is connected to another return conductor 6. Magnetic core 3, which overlaps supply conductors 5 and return conductors 6 at least partially perpendicular to main plane of extension 100, is shown schematically as a dashed line. Arrows 102 represent the magnetic flux, generated by supply conductors 5, which is greater than the magnetic flux represented by arrows 103, starting from return conductors 6. This is made clear by the different size of arrows 102, 103. The flux density generated in magnetic core 3 is thus mainly induced by supply conductors 5, while return conductors 6 are used mainly for the coil wiring of excitation coil 4.

FIG. 3 shows a schematic side view of a return conductor 6, a supply conductor 5, a contact element 7 and a magnetic core 3 of a magnetic field sensor 1 according to the first specific embodiment of the present invention. Moreover, FIG. 3 shows a flux density 50, which is generated by a current flow in return conductors 6, and a magnetic flux density 51, which is generated by supply conductors 5 by an electrical current flow through supply conductors 5. The magnetic flux density is comparatively greatly a function of the distance from the current-carrying conductor. The magnetic flux density generated by supply conductor 5 in magnetic core 3 is thus clearly greater than the magnetic flux density generated in magnetic core 3 by return conductor 6, so that the magnetic flux density of return conductor 6 and of supply conductor 5 do not mutually compensate for each other, and consequently, a net flux density is generated in magnetic core 3 which is available for the sensor function according to the "fluxgate" sensor principle of magnetometers 1.

What is claimed is:

1. A magnetic field sensor, comprising:
    a substrate; and
    a magnetic core, the substrate having an excitation coil for generating a magnetic flux in the magnetic core, the excitation coil having a coil cross section which is aligned generally perpendicular to a main plane of extension of the substrate;
    wherein in the substrate, detection coils for detecting the magnetic flux in the magnetic core have detection coil cross sections which are aligned perpendicularly to the main plane of extension of the substrate; and
    wherein the magnetic core is situated in a radial direction of the coil cross section of the excitation coil outside the coil cross section.

2. The magnetic field sensor as recited in claim 1, wherein the magnetic core is situated on an outer surface of the substrate.

3. The magnetic field sensor as recited in claim 1, wherein the substrate includes a layer construction, and the excitation coil includes a plurality of supply conductors and a plurality of return conductors, the plurality of supply conductors and the plurality of return conductors being situated at least one of: (a) in different layers of the layer construction, and (b) on different sides of the substrate.

4. The magnetic field sensor as recited in claim 3, wherein perpendicular to the main plane of extension an at least partial overlapping is provided of the plurality of the supply conductors by the magnetic core.

5. The magnetic field sensor as recited in claim 3, wherein perpendicular to the main plane of extension the plurality of supply conductors is situated between the magnetic core and the plurality of return conductors.

6. The magnetic field sensor as recited in claim 1, further comprising:
    at least one of contact elements, and dielectric layers situated perpendicular to the main plane of extension between the supply conductors and the return conductors.

7. A method for producing a magnetic field sensor, comprising:
    providing a substrate;
    producing an excitation coil in the substrate;
    positioning a magnetic core in a radial direction of a coil cross section of the excitation coil outside the coil cross section; and
    producing detection coils detecting a magnetic flux in the magnetic core and having detection coil cross sections which are aligned perpendicularly to a main plane of extension of the substrate.

8. The method as recited in claim 7, wherein the magnetic core is situated on an outer surface of the substrate.

9. The method as recited in claim 8, further comprising at least one of:
    producing a plurality of return conductors in the substrate;
    producing a plurality of supply conductors in the substrate; and
    producing at least one of a plurality of contact elements and a plurality of dielectric layers in the substrate.

* * * * *